US012772402B2

(12) United States Patent
Nagarajan et al.

(10) Patent No.: US 12,772,402 B2
(45) Date of Patent: Oct. 20, 2026

(54) ACTIVE AND PASSIVE ADAPTER FOR A MICROSD CARD

(71) Applicant: Sandisk Technologies, Inc., Milpitas, CA (US)

(72) Inventors: Raghavan Nagarajan, Bangalore (IN); Varun Gopal, Bangalore (IN); Hariharapandian S, Bangalore (IN); Balaji G K, Hosur (IN)

(73) Assignee: Sandisk Technologies, Inc., Milpitas, CA (US)

( * ) Notice: Subject to any disclaimer, the term of this patent is extended or adjusted under 35 U.S.C. 154(b) by 95 days.

(21) Appl. No.: 18/914,512

(22) Filed: Oct. 14, 2024

(65) Prior Publication Data

US 2026/0107399 A1 Apr. 16, 2026

(51) Int. Cl.
*H05K 5/02* (2006.01)

(52) U.S. Cl.
CPC .................................. *H05K 5/0286* (2013.01)

(58) Field of Classification Search
CPC .................................................... H05K 5/0286
See application file for complete search history.

(56) References Cited

U.S. PATENT DOCUMENTS 6,976,111 B1 * 12/2005 Mills ...................... G01C 21/20 439/946
7,194,565 B2 * 3/2007 Mills .................... H05K 5/0282 711/115
7,254,664 B2 8/2007 Hsieh
8,539,183 B2 * 9/2013 Harari .................. G06K 19/077 710/13
8,654,535 B2 * 2/2014 Lin .................. G06K 19/07741 361/737
8,657,612 B2 * 2/2014 Lu ...................... H01R 12/7011 439/328
8,886,864 B1 11/2014 Sung et al.
9,545,004 B2 * 1/2017 Minich .................. H05K 1/141
10,169,281 B2 1/2019 Hu et al.
10,528,076 B2 1/2020 Gupta et al.
11,497,131 B2 * 11/2022 Hung ................... H05K 7/1431
2012/0322287 A1 * 12/2012 Lu ...................... H01R 12/7011 439/328
2016/0356842 A1 * 12/2016 Lee ........................ G01R 1/045
2017/0053199 A1 * 2/2017 Kwon .............. G06K 19/07732
2019/0079890 A1 * 3/2019 Matula ................ G06F 13/4045
2020/0383205 A1 12/2020 Chang et al.

FOREIGN PATENT DOCUMENTS

KR 101321656 B1 * 10/2013 ......... H01R 13/6461
TW I720696 B 3/2021

* cited by examiner

*Primary Examiner* — Henry Tsai
*Assistant Examiner* — Christopher A Daley
(74) *Attorney, Agent, or Firm* — DENTONS Durham Jones Pinegar

(57) ABSTRACT

An adapter for a removable data storage device includes a substrate having a signal plane and ground plane. The signal plane includes a socket for receiving a removable data storage device, such as a microSD card. Traces are embedded in the signal plane of the substrate and electrically couple contact pins within the socket to corresponding contacts on the ground plane of the substrate. The traces are arranged as differential pairs which minimizes electromagnetic interference while enabling high data transfer rates and improved signal integrity.

20 Claims, 5 Drawing Sheets

ACTIVE AND PASSIVE ADAPTER FOR A MICROSD CARD

BACKGROUND

Removable data storage devices, such as SD cards and microSD cards, are typically used to expand storage capabilities of various electronic devices. When compared to a SD card, a microSD card has a smaller form factor. As such, microSD cards are typically used in small form factor electronic devices such as mobile telephones, gaming systems and cameras.

In some cases, microSD cards are usable in larger form factor devices such as desktop computers and laptop computers. To use the microSD card in larger form factor electronic devices, the microSD card is inserted into a microSD card adapter. The microSD card adapter is then inserted into an SD card interface slot in the larger form factor electronic device.

As the speed and capabilities of electronic devices continues to increase, the interface speed requirements of SD cards and microSD cards are also increasing. However, current microSD card adapters only support interface speeds up to two hundred eight megahertz (MHz). If higher interface speeds are used, read and/or write operations between the microSD card in the SD card adapter and the host device may fail.

Accordingly, it would be beneficial for a microSD card adapter to support higher interface speeds than those that are available using current microSD card adapters.

SUMMARY

The present disclosure describes an adapter for a removable data storage device. In an example, the removable data storage device is a microSD card or a microSD express card. The microSD card has a first form factor and is adapted to be received into a microSD interface slot of a host electronic device. However, when the microSD card is inserted into the adapter, the adapter enables the microSD card to be received into an interface slot for larger form factor removable data storage devices such as, for example, a SD card interface slot of a host device.

Additionally, and unlike current microSD card adapters, the adapter of the present disclosure enables high interface and/or transfer speeds. For example, the adapter of the present disclosure enables interface speeds of greater than two hundred eight megahertz (MHz), the current limit of existing microSD card adapters. The adapter of the present disclosure also reduces or eliminates the risk of read and/or write failures due to signal return loss, lack of impedance control and/or crosstalk.

As will be explained in greater detail herein, the adapter of the present disclosure is a substrate-based adapter having at least two layers or planes—a signal plane and a ground plane. The signal plane includes a socket for receiving a first type of removable data storage device (e.g., a microSD card). A plurality of traces are coupled to a respective plurality of contact pins in or otherwise associated with the socket. In an example, the traces are arranged as differential pairs and are embedded in the substrate. For example, each trace in a differential pair have the same or similar geometry, length and spacing.

The traces extend at least partially along the signal plane to contacts or pads on the other side and/or edge of the substrate and enable signals to pass between the contact pins associated with the socket to the contact or pads. The contacts or pads are sized, spaced and/or shaped based, at least in part, on a form factor of another removable data storage device (e.g., a SD card). The ground plane enables a return current to flow back to a source thereby completing the electrical circuit and/or a current flow cycle.

Accordingly, examples of the present disclosure describe an adapter for a removable data storage device. In an example, the adapter includes a socket coupled to a signal plane of a substrate. The socket receives a removable data storage device. A plurality of traces extend from the socket and extend at least partially across the signal plane of the substrate. The adapter also includes a plurality of contacts opposite the socket. In an example, each contact of the plurality of contacts are coupled to a respective trace of the plurality of traces. The adapter also includes a ground plane opposite the signal plane.

Examples also describe an adapter for a removable data storage device. In this example, the adapter includes a substrate having a signal plane and a ground plane opposite the signal plane. A socket is coupled to the signal plane. The socket includes a plurality of contact pins. A plurality of traces are embedded in the substrate and extend from the plurality of contact pins and connect the plurality of contact pins to a plurality of contacts.

Other examples describe an adapter for a removable data storage device. In this example, the substrate includes a signal plane and a ground plane opposite the signal plane. The adapter also includes a receiving means coupled to the signal plane. The receiving means includes a plurality of first contact means. In an example, a plurality of signal means are embedded in the substrate and extend from the plurality of first contact means. The signal means connect the plurality of first contact means to a plurality of second contact means.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
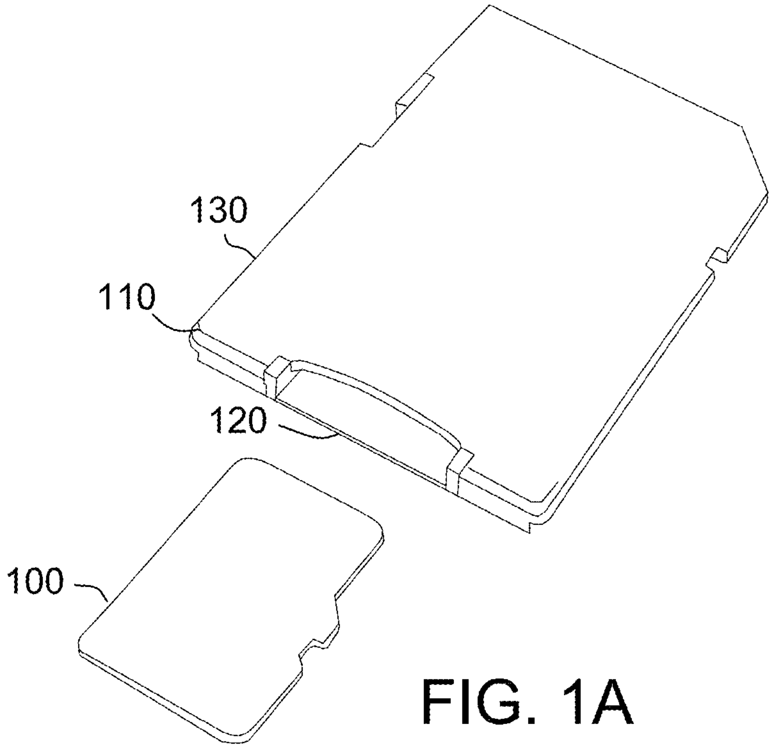
FIG. 1A illustrates a microSD card and a microSD card adapter according to current solutions.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

SD cards and microSD cards, along with other types of removable data storage devices, are used to expand the storage capabilities of various electronic devices. For example, microSD cards are typically used in small form factor electronic devices such as mobile telephones, gaming systems and cameras. Likewise, SD cards, having a larger form factor when compared to microSD cards, are typically used in larger form factor electronic devices such as laptop computers and desktop computers.

To increase the versatility of microSD cards, microSD card adapters are typically used to enable microSD cards to be usable in large form factor devices. For example, the microSD card is inserted into a microSD card adapter. The microSD card adapter is then inserted into an SD card interface slot in the larger form factor electronic device.

As the speed and capabilities of electronic devices continues to increase, the interface speed requirements of SD cards and microSD cards are also increasing. However, current microSD card adapters only support interface speeds up to two hundred eight megahertz (MHz). If higher interface speeds are used, read and/or write operations between the microSD card and the host device may fail.

To address the above, the present disclosure describes an adapter for a removable data storage device. In an example, the removable storage device is a microSD card or a microSD express card. The adapter of the present disclosure enables high interface speeds between the microSD card and the host device. For example, the adapter of the present disclosure enables interface and/or transfer speeds of greater than two hundred eight MHz and also reduces or eliminates the risk of read and/or write failures due to signal return loss, lack of impedance control and/or crosstalk.

In an example, the adapter is a substrate-based adapter having at least two layers or planes—a signal layer/plane and a ground layer/plane. The signal plane includes a socket for receiving a first type of removable data storage device (e.g., a microSD card). A plurality of traces are coupled to a respective plurality of contact pins in or otherwise associated with the socket. In an example, the traces are arranged as differential pairs and are embedded in the substrate. For example, each trace in a differential pair have the same or similar geometry, length and spacing. The traces extend at least partially along the signal plane to contacts or pads on the other side and/or edge of the substrate and enable signals to pass between the contact pins associated with the socket to the contact or pads. The contacts or pads are sized, spaced and/or shaped based, at least in part, on a form factor of another removable data storage device (e.g., a SD card). The ground plane enables a return current to flow back to a source thereby completing the electrical circuit and/or a current flow cycle.

Accordingly, many technical benefits may be realized including, but not limited to increasing the signal transmission speed between a removable data storage device and a host device; reducing or eliminating electrical losses; and increasing the signal reliability between a removable data storage device and a host device.

These and other examples will be shown and described in greater detail with respect to FIG. 1-FIG. 5.

FIG. 1A illustrates a microSD card 100 and a microSD card adapter 110 according to current solutions. In current implementations, the microSD card 100 has a first form factor and/or a first set of dimensions. As previously explained, the form factor of the microSD card 100 enables the microSD card to be inserted into small form factor computing devices.

To expand the versatility of the microSD card 100 and/or to enable the microSD card to be used in larger form factor electronic devices, the microSD card 100 can be inserted into the microSD card adapter 110. For example, the microSD card 100 is insertable and removable from the microSD slot 120 provided in housing 130 of the microSD card adapter 110. However, due to the lead frame design of the microSD card adapter 110, the interface and/or transfer speed between the microSD card 100 and a host device is limited (e.g., limited to two hundred eight MHz).

Figure 1B:
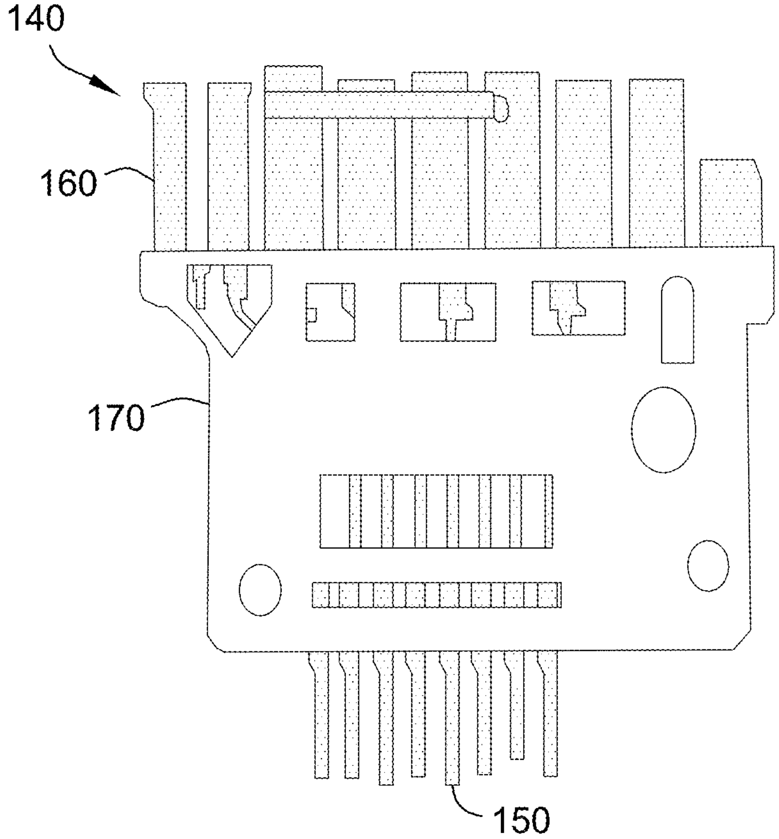
FIG. 1B illustrates a lead frame of the microSD card adapter of FIG. 1A.

FIG. 1B illustrates a lead frame 140 of the microSD card adapter 110 of FIG. 1A. The lead frame 140 is contained within the housing 130 of the microSD card adapter 110. In current implementations, the lead frame 140 includes a set of microSD card contact pins 150. The microSD card contact pins 150 are sized, spaced, positioned and shaped to mate with corresponding contacts on the microSD card 100 (FIG. 1A).

Additionally, each microSD card contact pin 150 extends into a SD card contact 160. For example, the leftmost microSD card contact pin 150 and the leftmost SD card contact 160 are a single unitary structure or piece. The SD card contacts 160 are larger than the microSD card contact pins 150 and are sized, shaped, spaced and positioned to mate with or contact corresponding contacts of a host device. The lead frame 140 also includes a plastic portion 170 or body that provides support for the microSD card contact pins 150 and the SD card contacts 160.

However, as previously mentioned, the lead frame 140 is limited with regard to its interface speed. Additionally, the lead frame 140 is also limited regarding the number of microSD card contact pins 150 it can support. For example and as shown in FIG. 1B, the lead frame only includes a single row of microSD card contact pins 150. However, newer, more advanced microSD cards may have multiples rows of contacts. As such, a SD card adapter will also need multiple rows of microSD card contact pins—which would be difficult to add in the lead frame 140.

Figure 2A:
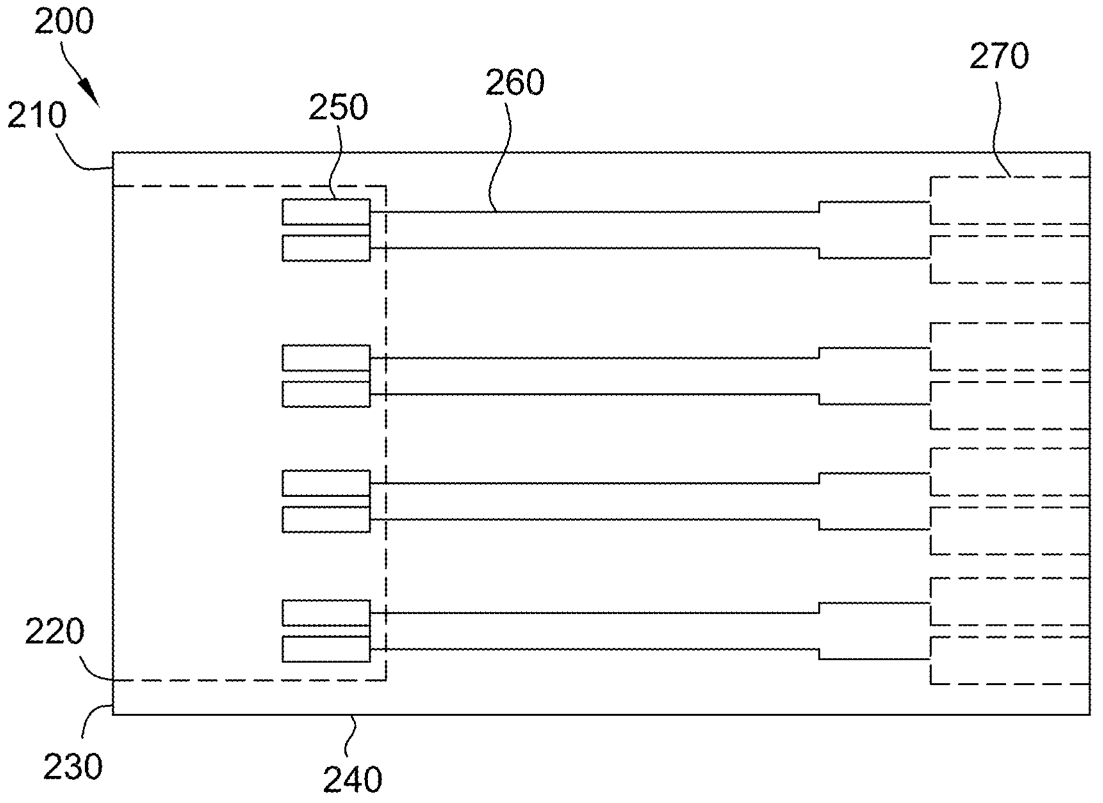
FIG. 2A illustrates a substrate-based microSD card adapter according to an example.

FIG. 2A illustrates a substrate-based microSD card adapter 200 according to an example. In an example, the substrate-based microSD adapter 200 shown in FIG. 2A replaces the lead frame 140 shown and described with respect to FIG. 1B. For example, the substrate-based microSD card adapter 200 can be placed within the housing 130 (FIG. 1A) (or within a similar housing) in lieu of the lead frame 140.

In an example, the substrate-based microSD card adapter 200 is referred to as a passive adapter. Due to the inclusion of a substrate, along with other features, the substrate-based microSD card adapter 200 has a controlled impedance channel which controls the impedance of various signals as the signals are transmitted between a removable data storage device (e.g., a microSD card) and a host device. As a result, the substrate-based microSD card adapter 200 has better timing margins when compared with the microSD card adapter 110 shown and described with respect to FIG. 1A. Additionally, the substrate-based microSD card adapter 200 increases interoperability between the removable data storage device and the host device when compared with the microSD card adapter 110.

The substrate-based microSD card adapter 200 includes a substrate 210. In an example, the substrate-based microSD card adapter 200 is comprised of a single substrate 210. In such examples, the substrate 210 includes a signal plane 230 and a ground plane 240. In an example, the signal plane 230 is on or associated with a first planar surface of the substrate 210 and the ground plane 240 is on or associated with a second planar surface of the substrate 210. The second planar surface is opposite the first planar surface.

In another example, the substrate-based microSD card adapter 200 is comprised of multiple substrates or dielectric layers that are stacked together. For example, the substrate-based microSD card adapter 200 includes a first dielectric layer and a second dielectric layer. A ground layer (e.g., the ground plane 240) or inner layer is sandwiched between the first dielectric layer and the second dielectric layer. Additionally, the signal plane 230 is provided on a first planar surface of the first dielectric layer.

In an example, the substrate-based microSD card adapter 200 includes or is otherwise associated with a socket 220. The socket 220 is placed on or otherwise coupled to the signal plane 230 of the substrate-based microSD card adapter 200. The socket 220 is sized and/or shaped to receive a microSD card.

The substrate-based microSD card adapter 200 also includes a plurality of contact pins 250. In an example, the plurality of contact pins 250 are contained and/or housed within the socket 220. The contact pins 250 are sized, shaped, positioned and/or spaced to contact respective contacts on a microSD card or a microSD express card that is inserted into the socket 220. Although a single row of contact pins 250 are shown and described, the substrate-based microSD card adapter 200 may have multiple rows of contact pins 250. Additionally, although eight contact pins are shown in FIG. 2A, the substrate-based microSD card adapter 200 may have any number of contact pins 250.

The substrate-based microSD card adapter 200 also includes a plurality of traces 260. The traces 260 may be part of the signal layer and are provided on top of, or embedded in, the substrate 210. The traces 260 extend, at least partially, across the signal plane 230 of the substrate 210. Each trace 260 is coupled to a respective contact pin 250 of the plurality of contact pins 250. In an example, a particular trace 260 is associated with another trace 260 to form a pair of traces or to form differential signal pairs. For example, each trace 260 in the differential signal pair carry equal and/or opposite signals which improves the strength of the signal while also reducing noise.

In some examples, each trace 260 of the differential signal pair has the same (or similar) length, width and/or spacing as each other and are referenced to the same ground plane 240. In addition to reducing noise, the differential signals helps minimize electromagnetic interference generated by the signal pair. Arranging the traces 260 as differential signal pairs also enables higher transfer and/or data rates and improved signal integrity when compared with the lead frame 140 shown and described with respect to FIG. 1B.

In an example, the substrate-based microSD card adapter 200 also includes a plurality of contacts 270. The contacts 270 are provided on the substrate-based microSD card adapter 200 opposite the contact pins 250. For example, the contact pins 250 are provided at or near a proximal side of the substrate-based microSD card adapter 200 and the contacts 270 are provided at or near a distal side of the substrate-based microSD card adapter 200.

In an example, the contacts 270 are provided on the signal plane 230 of the substrate-based microSD card adapter 200. In another example, the contacts 270 are provided on the ground plane 240 of the substrate-based microSD card adapter 200. In another example, the contacts 270 are placed on the second dielectric layer. Regardless of where the contacts 270 are provided, the contacts 270 are sized, spaced and/or positioned to contact corresponding contacts in a host device in which the substrate-based microSD card adapter 200 will be inserted into. Additionally, although eight contacts 270 are shown, the substrate-based microSD card adapter 200 may include any number of contacts 270 and/or the contacts 270 may be arranged in various rows.

In an example one or more vias are provided in the substrate 210. The vias extend from a first surface of the substrate to a second surface of the substrate. In an example, the traces 260 extend from between respective contact pins 250, through the vias to respective contacts 270.

Figure 2B:
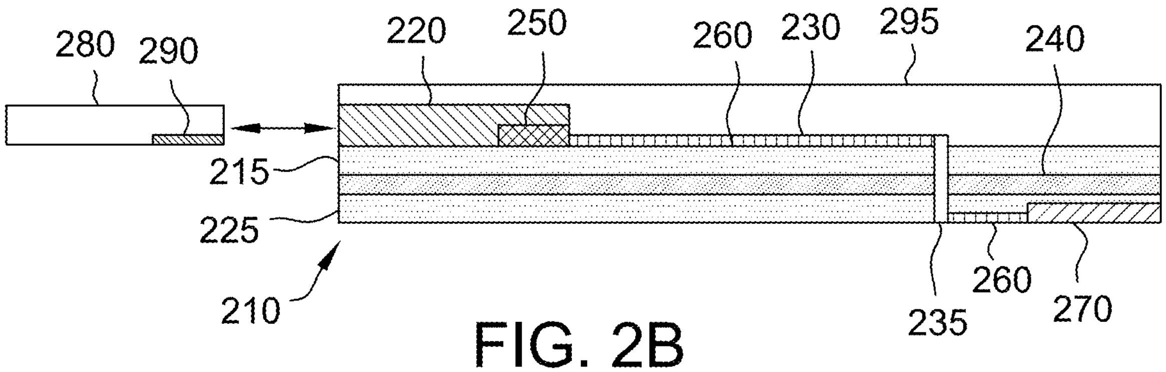
FIG. 2B illustrates a cross-section view of the substrate-based microSD card adapter of FIG. 2A according to an example.

FIG. 2B illustrates a cross-section view of the substrate-based microSD card adapter 200 of FIG. 2A according to an example. In an example, the substrate-based microSD card adapter 200 is contained within a housing 295. The housing 295 may be similar to the housing 130 shown and described with respect to FIG. 1A.

The substrate-based microSD card adapter 200 includes a substrate 210. In an example, the substrate 210 consists of multiple layers and/or planes. For example, the substrate 210 includes a first dielectric layer 215 and a second dielectric layer 225.

The signal plane 230 is provided on, or integrated with, a planar surface of the first dielectric layer 215. In an example, the ground plane 240, or the ground layer, is provided opposite the signal plane 230 and/or is provided between the first dielectric layer 215 and the second dielectric layer 225. In an example, the ground plane 240 includes a ceramic material, a metal material (e.g., copper) or other material.

One or more vias 235 extend within the substrate 210. For example, the vias 235 extend from/between/within the first dielectric layer 215, the ground plane 240 and the second dielectric layer 225. The signal plane 230 includes the plurality of traces 260. In an example, the traces 260 extend at least partially across a planar surface of the first dielectric layer 215, through the vias 235, and are coupled to the contacts 270 provided on the second dielectric layer 225. In an example, the traces 260 may be part of a bottom trace layer such as shown in FIG. 2B. As such, the traces 260 electrically couple the contact pins 250 within the socket 220 to the contacts 270.

As also shown in FIG. 2B, a removable data storage device 280, such as a microSD card or a microSD express card, is insertable and removable from the socket 220. When in the socket 220, contacts 290 of the removable data storage device 280 contact the contact pins 250 of the substrate-based microSD card adapter 200.

Figure 3A:
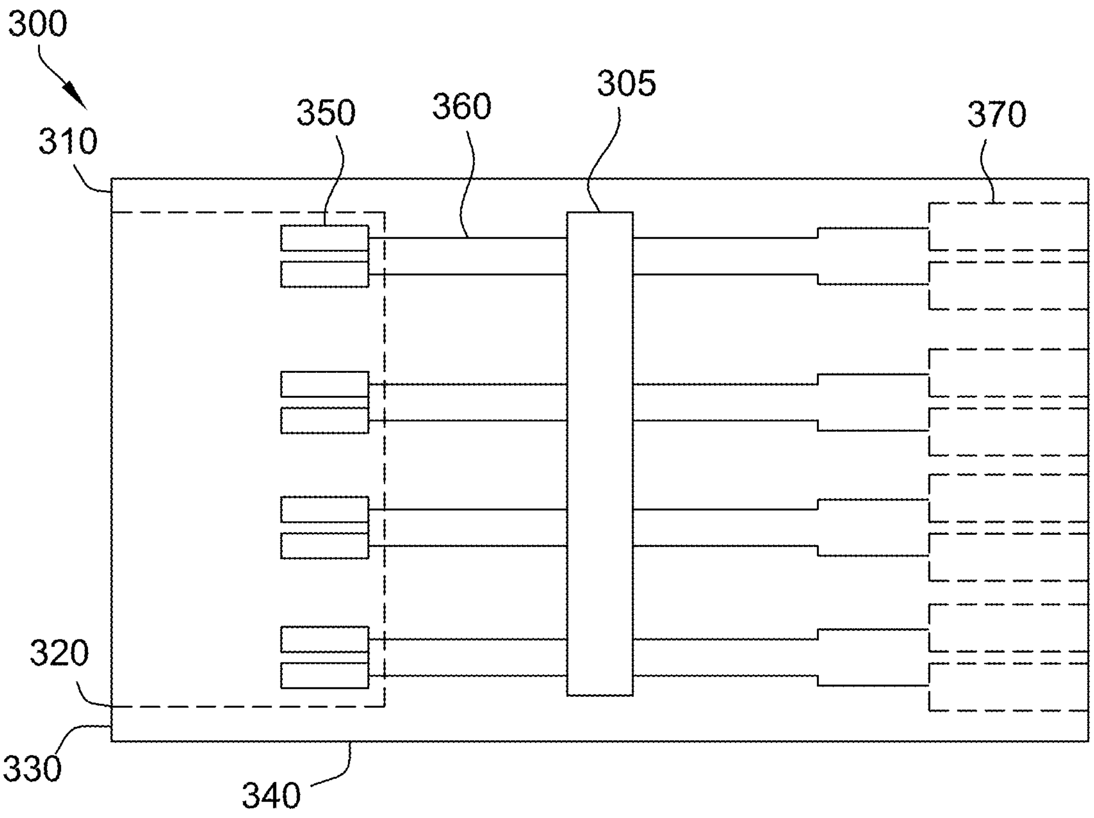
FIG. 3A illustrates a substrate-based microSD card adapter according to another example.

FIG. 3A illustrates a substrate-based microSD card adapter 300 according to another example. In an example, the substrate-based microSD adapter 300 shown in FIG. 3A is similar to the substrate-based microSD adapter 200 shown and described with respect to FIG. 2A -FIG. 2B. However, unlike the passive nature of the substrate-based microSD card adapter 200 shown and described with respect to FIG. 2A-FIG. 2B, the substrate-based microSD card adapter 300 is referred to as an active adapter.

For example, the substrate-based microSD card adapter 300 includes a substrate 310. The substrate-based microSD card adapter 300 can be comprised of a single substrate 310 or a substrate with multiple layers (e.g., a first dielectric layer and a second dielectric layer) that are stacked on top of each other. Regardless of the configuration, the substrate-based microSD adapter 300 includes a signal plane 330 and a ground plane 340 that is opposite the signal plane 330. As with the previous example, the signal plane 330 is on or is associated with a first planar surface of the substrate 310 and the ground plane 340 is on or is associated with a second planar surface of the substrate 310.

The substrate-based microSD card adapter 300 includes or is otherwise associated with a socket 320. The socket 320 is placed on or otherwise coupled to the signal plane 330 of the substrate-based microSD card adapter 300. The socket 320 is sized and/or shaped to receive a removable data storage device such as, for example, a microSD card or a microSD express card.

In an example, the substrate-based microSD card adapter 300 includes a plurality of contact pins 350. In an example, the plurality of contact pins 350 are contained and/or housed within the socket 320. The contact pins 350 are sized, shaped, positioned and/or spaced to contact respective contacts on a removable data storage device (e.g., a microSD card or a microSD express card) that is inserted into the socket 320. Although a single row of contact pins 350 are shown and described, the substrate-based microSD card adapter 300 may have multiple rows of contact pins 350. Additionally, although eight contact pins are shown in FIG. 3A, the substrate-based microSD card adapter 300 may have any number of contact pins 350.

The substrate-based microSD card adapter 300 also includes a plurality of traces 360. The traces 360 are embedded in the substrate 310 and extend, at least partially, across the signal plane 330 of the substrate 310. Each trace 360 is coupled to a respective contact pin 350 of the plurality of contact pins 350. As previously explained, the traces 360 are arranged and/or grouped as differential signal pairs.

The substrate-based microSD card adapter 300 also includes a plurality of contacts 370. The contacts 370 are provided on the substrate-based microSD card adapter 300 opposite the contact pins 350. In an example, the contacts 370 are provided on the signal plane 330 of the substrate-based microSD card adapter 300. In another example, the contacts 370 are provided on the ground plane 340 of the substrate-based microSD card adapter 300. In yet another example, the contacts 370 are provided on a bottom planar surface of the substrate 310 (e.g., on a second dielectric layer). The traces 360 extend from the contact pins 350, through one or more vias, and are connected to the contacts 370.

Regardless of where the contacts 370 are provided, the contacts 370 are sized, spaced and/or positioned to contact corresponding contacts in a host device in which the substrate-based microSD card adapter 300 will be inserted into. Additionally, although eight contacts 370 are shown, the substrate-based microSD card adapter 300 may include any number of contacts 370.

As previously described, the substrate-based microSD card adapter 300 is referred to as an active adapter. In this example, the substrate-based microSD card adapter 300 includes a retimer 305. In an example, the retimer 305 is coupled to the traces 360 and/or provided between the contact pins 350 and the contacts 370. The retimer 305 recovers and/or retransmits a signal between the contact pins 350 and the contacts 370 so that the signal quality between the contacts is maintained. Although a retimer 305 is specifically mentioned, other circuitry or components may be used.

In an example, the retimer 305 is controlled by software. For example, software-based control mechanisms within a PCIe interface may be used to activate and/or control the retimer 305. In another example, the retimer 305 is controllable using sideband communications. For example, sideband communications over the existing PCIe interface may be used to allow control signals and/or commands to be sent alongside data flow. Sideband communications can carry control information, such as retimer configuration commands, using signaling conventions that do not interfere with the primary data exchange. In an example, this is achieved by muxing existing legacy SD lines for sideband communication.

Figure 3B:
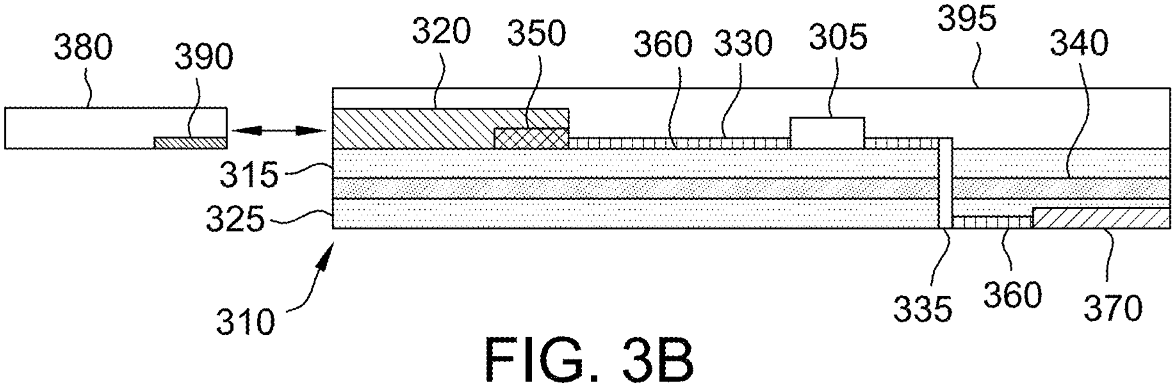
FIG. 3B illustrates a cross-section view of the substrate-based microSD card adapter of FIG. 3A according to an example.

FIG. 3B illustrates a cross-section view of the substrate-based microSD card adapter 300 of FIG. 3A according to an example. In an example, the substrate-based microSD card adapter 300 is contained within a housing 395. The housing 395 may be similar to the housing 130 shown and described with respect to FIG. 1A.

As with the example shown and described with respect to FIG. 2B, the substrate-based microSD card adapter 300 includes a substrate 310. In an example, the substrate 310 consists of multiple layers and/or planes. For example, the substrate 310 includes a first dielectric layer 315 and a second dielectric layer 325.

The signal plane 330 is provided on, or integrated with, a planar surface of the first dielectric layer 315. The retimer 305 is provide on or otherwise associated with the first dielectric layer 315. In an example, the ground plane 340, or the ground layer, is provided opposite the signal plane 330 and/or is provided between the first dielectric layer 315 and the second dielectric layer 325. In an example, the ground plane 340 includes a ceramic material, a metal material (e.g., copper) or other material.

One or more vias 335 extend within the substrate 310. For example, the vias 335 extend from/between/within the first dielectric layer 315, the ground plane 340 and the second dielectric layer 325.

The signal plane 330 includes the plurality of traces 360 and the plurality of traces 360 are coupled to retimer 305. For example, the traces 360 extend at least partially across a planar surface of the first dielectric layer 315, are coupled to the retimer 305 and continue through the vias 335. The traces (or a bottom trace layer) are coupled to the contacts 370 provided on the second dielectric layer 325.

As also shown in FIG. 3B, a removable data storage device 380, such as a microSD card or a microSD express card, is insertable and removable from the socket 320. When in the socket 320, contacts 390 of the removable data storage device 380 contact the contact pins 350 of the substrate-based microSD card adapter 300.

Figure 4:
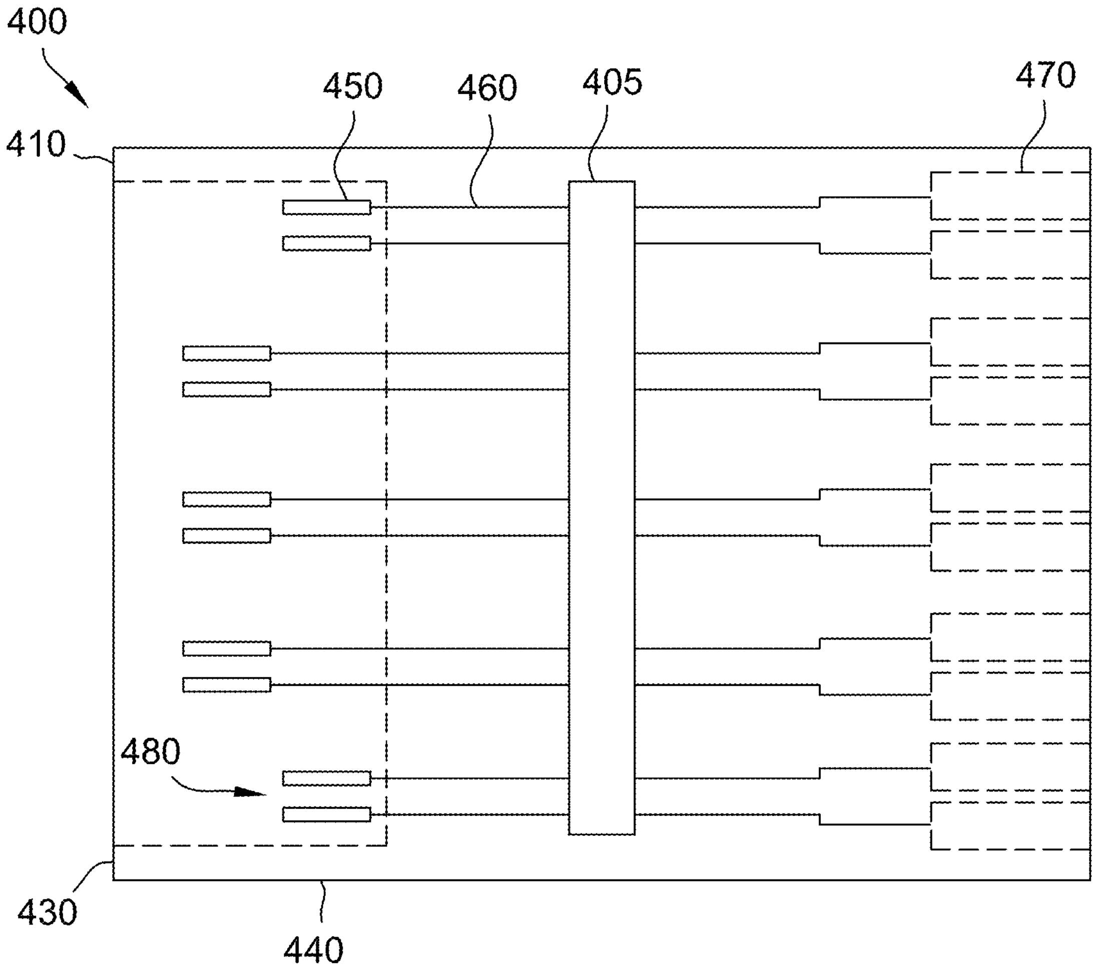
FIG. 4 illustrates a substrate-based microSD card adapter according to another example.

FIG. 4 illustrates a substrate-based microSD card adapter 400 according to another example. In an example, the substrate-based microSD adapter 400 shown in FIG. 4 is similar to the various substrate-based microSD adapters shown and described herein.

For example, the substrate-based microSD card adapter 400 includes a substrate 410 having a signal plane 430 and a ground plane 440 that is opposite the signal plane 430. The substrate-based microSD card adapter 400 includes or is otherwise associated with a socket 420 that is placed on or otherwise coupled to the signal plane 430. As with other examples described herein, the socket 420 is sized and/or shaped to receive a removable data storage device such as, for example, a microSD card or a microSD express card.

In an example, the substrate-based microSD card adapter 400 includes a plurality of contact pins 450 contained in, or otherwise associated with, the socket 420. However, in this example, the contact pins 450 are arranged in multiple different rows. For example, a first row 480 includes a first set of contact pins 450 and a second row 490 includes a second row of contact pins 450. In each row, the contact pins 450 are sized, shaped, positioned and/or spaced to contact respective contacts on a removable data storage device.

The substrate-based microSD card adapter 400 also includes a plurality of traces 460. The traces 460 are embedded in the substrate 410 and extend from each contact pin 450 of each row, at least partially, across the signal plane 430 of the substrate 410. In an example, the traces 460 are arranged and/or grouped as differential signal pairs.

The substrate-based microSD card adapter 400 also includes a plurality of contacts 470. The contacts 470 are arranged and/or provided on the substrate-based microSD card adapter 400 opposite the contact pins 450 such as previously described. In this example, the substrate-based microSD card adapter 400 also includes a retimer 405. However, in some examples, the retimer 405 is omitted.

Figure 5:
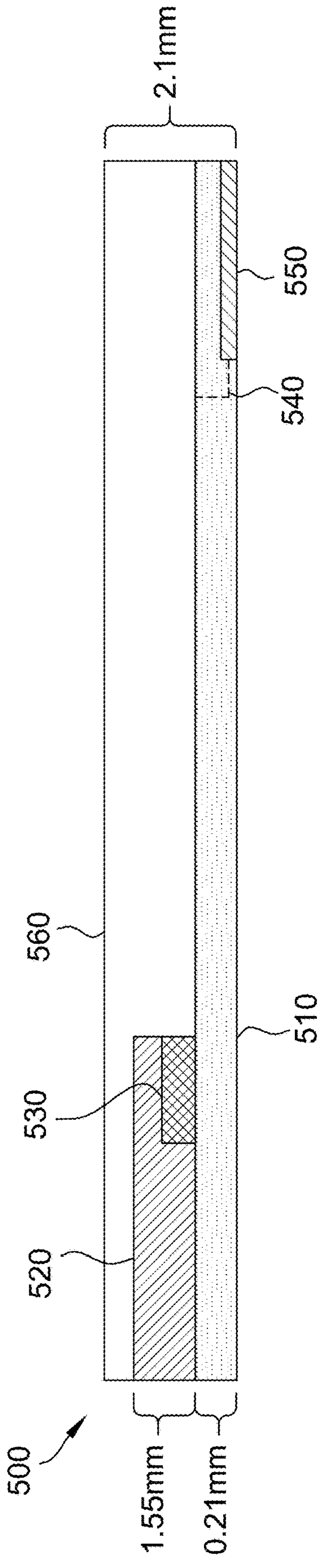
FIG. 5 illustrates measurements of a substrate-based microSD card adapter according to an example.

FIG. 5 illustrates measurements of an SD card adapter 500 according to an example. In an example, the SD card adapter 500 is similar to the various substrate-based microSD card adapters shown and described herein.

In this example, the SD card adapter 500 includes a substrate 510 having a multi-layer design. For example, the substrate 510 includes a signal layer (or a signal plane) and a ground layer (or a ground plane). In an example, a thickness or height of the substrate 510 (including a substrate having multiple dielectric layers) is 0.21 mm. Although a precise measurement is given, the substrate 510 may have other thicknesses.

The SD card adapter 500 also includes a socket 520. The socket 520 is adapted to receive a removable data storage device such as previously described. In an example, the socket 520 includes a plurality of contact pins 530 and has a height of 1.55 mm. As previously described, a plurality of traces 540 extend from the contact pins 530 and are electrically couple the contact pins 530 to a plurality of contacts 550.

In an example, a housing 560 at least partially surrounds and/or encloses the substrate 510, the socket 520, the traces 540 and the various contacts. In an example, and in order to ensure the SD card adapter 500 fits within SD card interface slots of a host device, the overall height of the SD card adapter 500 is 2.1 mm. Although specific measurements have been given, these are for example purposes only.

Based on the above, examples of the present disclosure describe an adapter for a removable data storage device, comprising: a socket coupled to a signal plane of a substrate, the socket receiving a removable data storage device; a plurality of traces extending from the socket and at least partially across the signal plane of the substrate; a plurality of contacts opposite the socket, each contact of the plurality of contacts being coupled to a respective trace of the plurality of traces; and a ground plane opposite the signal plane. In an example, the plurality of traces are arranged as differential signal pairs. In an example, each trace of the plurality of traces extending from the socket are coupled to respective contact pins associated with the socket. In an example, the respective contact pins are arranged to contact multiple rows of contacts on the removable data storage device. In an example, the adapter also includes a retimer coupled to the signal plane, the retimer positioned between the socket and the plurality of contacts. In an example, the adapter is receivable in a host device. In an example, the adapter also includes a housing at least partially surrounding the substrate. In an example, the removable data storage device is a micro secure digital (SD) express card.

Other examples describe an adapter for a removable data storage device, comprising: a substrate comprising: a signal plane; and a ground plane opposite the signal plane; a socket coupled to the signal plane and having a plurality of contact pins; and a plurality of traces embedded in the substrate and extending from the plurality of contact pins and connecting the plurality of contact pins to a plurality of contacts. In an example, the adapter also includes a retimer coupled to the signal plane between the socket and the plurality of contacts. In an example, the socket receives a micro secure digital (SD) express card. In an example, the plurality of traces are arranged as differential signal pairs. In an example, the plurality of contact pins are arranged to contact multiple rows of contacts on the removable data storage device. In an example, the adapter is receivable in a host device. In an example, the adapter also includes a housing at least partially surrounding the substrate.

Examples also describe an adapter for a removable data storage device, comprising: a substrate comprising: a signal plane; and a ground plane opposite the signal plane; a receiving means coupled to the signal plane and having a plurality of first contact means; and a plurality of signal means embedded in the substrate and extending from the plurality of first contact means and connecting the plurality of first contact means to a plurality of second contact means. In an example, the first plurality of contact means have a first set of dimensions and the second plurality of contact means have a second dimension. In an example, the adapter also includes a signal quality means coupled to the signal plane. In an example, the signal quality means is a retimer. In an example, the plurality of signal means are arranged as differential signal pairs.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. An adapter for a removable data storage device, comprising:
- a socket coupled to a signal plane of a substrate, the socket receiving a removable data storage device;
- a plurality of traces extending from the socket and at least partially across the signal plane of the substrate;
- a plurality of contacts opposite the socket, each contact of the plurality of contacts being coupled to a respective trace of the plurality of traces; and
- a ground plane opposite the signal plane.

2. The adapter of claim 1, wherein the plurality of traces are arranged as differential signal pairs.

3. The adapter of claim 1, wherein each trace of the plurality of traces extending from the socket is coupled to respective contact pins associated with the socket.

4. The adapter of claim 3, wherein the respective contact pins are arranged to contact multiple rows of contacts on the removable data storage device.

5. The adapter of claim 1, further comprising a retimer coupled to the signal plane, the retimer positioned between the socket and the plurality of contacts.

6. The adapter of claim 1, wherein the adapter is receivable in a host device.

7. The adapter of claim 1, further comprising a housing at least partially surrounding the substrate.

8. The adapter of claim 1, wherein the removable data storage device is a micro secure digital (SD) express card.

9. An adapter for a removable data storage device, comprising:
- a substrate comprising:
  - a signal plane; and
  - a ground plane opposite the signal plane;
- a socket coupled to the signal plane and having a plurality of contact pins; and
- a plurality of traces embedded in the substrate and extending from the plurality of contact pins and connecting the plurality of contact pins to a plurality of contacts.

10. The adapter of claim 9, further comprising a retimer coupled to the signal plane between the socket and the plurality of contacts.

11. The adapter of claim 9, wherein the socket receives a micro secure digital (SD) express card.

12. The adapter of claim 9, wherein the plurality of traces are arranged as differential signal pairs.

13. The adapter of claim 9, wherein the plurality of contact pins are arranged to contact multiple rows of contacts on the removable data storage device.

14. The adapter of claim 9, wherein the adapter is receivable in a host device.

15. The adapter of claim 9, further comprising a housing at least partially surrounding the substrate.

16. An adapter for a removable data storage device, comprising:
- a substrate comprising:
  - a signal plane; and
  - a ground plane opposite the signal plane;
- a receiving means coupled to the signal plane and having a plurality of first contact means; and
- a plurality of signal means embedded in the substrate and extending from the plurality of first contact means and connecting the plurality of first contact means to a plurality of second contact means.

17. The adapter of claim 16, wherein the plurality of first contact means have a first set of dimensions and the plurality of second contact means have a second dimension.

18. The adapter of claim 16, further comprising a signal quality means coupled to the signal plane.

19. The adapter of claim 18, wherein the signal quality means is a retimer.

20. The adapter of claim 16, wherein the plurality of signal means are arranged as differential signal pairs.

* * * * *